(12) United States Patent
Cho et al.

(10) Patent No.: US 11,366,364 B2
(45) Date of Patent: Jun. 21, 2022

(54) DISPLAY PANEL AND MANUFACTURING METHOD THEREOF AND DISPLAY DEVICE

(71) Applicants: HKC Corporation Limited, Guangdong (CN); Chongqing HKC Optoelectronics Technology Co., Ltd., Chongqing (CN)

(72) Inventors: En-Tsung Cho, Chongqing (CN); Kun Fan, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 198 days.

(21) Appl. No.: 16/499,722

(22) PCT Filed: May 12, 2017

(86) PCT No.: PCT/CN2017/084130
§ 371 (c)(1),
(2) Date: Sep. 30, 2019

(87) PCT Pub. No.: WO2018/184275
PCT Pub. Date: Oct. 11, 2018

(65) Prior Publication Data
US 2020/0285122 A1    Sep. 10, 2020

(30) Foreign Application Priority Data
Apr. 5, 2017    (CN) .......................... 201710217460.3

(51) Int. Cl.
*H01L 27/32* (2006.01)
*G02F 1/1362* (2006.01)
(Continued)

(52) U.S. Cl.
CPC ...... *G02F 1/136209* (2013.01); *G02F 1/1368* (2013.01); *H01L 27/1222* (2013.01);
(Continued)

(58) Field of Classification Search
CPC ..... H01L 25/048; H01L 25/167; H01L 27/15; H01L 27/288; H01L 27/32;
(Continued)

(56) References Cited

U.S. PATENT DOCUMENTS

2009/0184323 A1*  7/2009  Yang ..................... H01L 27/124
                                                257/72
2011/0273651 A1*  11/2011  Kim ....................... H01L 27/12
                                                349/110
(Continued)

FOREIGN PATENT DOCUMENTS

CN    201867561 U    6/2011
CN    102540539 A    7/2012
(Continued)

*Primary Examiner* — Samuel Park
(74) *Attorney, Agent, or Firm* — Muncy, Geissler, Olds & Lowe, P.C.

(57) ABSTRACT

A display panel, a manufacturing method thereof and a display device are provided. The display panel includes a substrate and a plurality of active switches disposed on the substrate. The active switch includes a gate layer disposed on a bottom portion. The gate layer is wound with an insulation medium layer, and the insulation medium layer includes a light-obstructing layer disposed on a side portion of the gate layer.

3 Claims, 3 Drawing Sheets

(51) Int. Cl.
*G02F 1/1368* (2006.01)
*H01L 27/12* (2006.01)
*H01L 29/417* (2006.01)
*H01L 29/423* (2006.01)
*H01L 29/66* (2006.01)
*H01L 29/786* (2006.01)

(52) U.S. Cl.
CPC .... *H01L 27/1259* (2013.01); *H01L 29/41733* (2013.01); *H01L 29/42384* (2013.01); *H01L 29/66765* (2013.01); *H01L 29/78633* (2013.01); *H01L 29/78669* (2013.01); *G02F 1/136222* (2021.01); *G02F 2202/103* (2013.01)

(58) Field of Classification Search
CPC ..... H01L 51/0032; H01L 51/05; H01L 51/00; H01L 27/1222; H01L 27/1259; H01L 29/41733; H01L 29/42384; H01L 29/66765; H01L 29/78633; H01L 29/78669; H01L 51/447; G02F 1/136209; G02F 1/1368; G02F 1/136222; G02F 2202/103

See application file for complete search history.

(56) References Cited

U.S. PATENT DOCUMENTS

2012/0113366 A1* 5/2012 Xie ............... H01L 29/4908 349/106
2017/0148862 A1* 5/2017 Xu ................ H01L 27/3262

FOREIGN PATENT DOCUMENTS

| | | |
|---|---|---|
| CN | 104965365 A | 10/2015 |
| CN | 105446031 A | 3/2016 |
| KR | 10-2008-0003090 A | 1/2008 |
| KR | 10-2008-0057034 A | 6/2008 |

* cited by examiner

DISPLAY PANEL AND MANUFACTURING METHOD THEREOF AND DISPLAY DEVICE

BACKGROUND

Technical Field

This disclosure relates to a technical field of a display, and more particularly to a display panel and a manufacturing method thereof, and a display device.

Related Art

The display has many advantages, such as the slim body, the power-saving property, the radiation less property and the like, and has been widely used. Most of the displays in the existing market are backlight displays, which include a display panel and a backlight module. The working principle of the display panel is to refract the light rays from the backlight module to produce a frame by placing liquid crystal molecules in two parallel substrates, and by applying a driving voltage to the two substrates to control the orientations of the liquid crystal molecules.

A thin film transistor-liquid crystal display (TFT-LCD) has the low power consumption, excellent frame quality and high production yield and other performances, and has now gradually occupied the dominant position in the display field. Similarly, the TFT-LCD includes the display panel and the backlight module. The display panel includes a color filter substrate (CF substrate, also referred to as a color filter substrate), a thin film transistor substrate (TFT substrate) and a mask, and the transparent electrode is present on the opposite inner sides of the above-mentioned substrates. A layer of liquid crystal (LC) molecules is disposed between the two substrates.

The thin film transistor liquid crystal display is developed in the direction toward the aspects of oversized size, high driving frequency, high resolution and the like. However, the TFT structure often has the inverted staggered structure. That is, the bottom gate electrode and the source/drain are respectively disposed on two sides of the a-Si layer. Such the structural device tends to have the portion that can be easily affected by the backlight, so that the leakage current is generated, and this is neither safe nor energy saving. Meanwhile, this is not advantageous to the normal work of the apparatus.

SUMMARY

The technical problem to be solved by this disclosure is to provide a display panel with the reduced leakage current and the higher use efficiency.

The present disclosure also provide a manufacturing method of a display panel.

In addition, the present disclosure further provide a display device.

To achieve the above objectives, the present disclosure provide a display panel comprising a substrate and a plurality of active switches. The active switch comprises a gate layer disposed on a bottom portion. The gate layer is wound with an insulation medium layer. The insulation medium layer comprises a light-obstructing layer disposed on a side portion of the gate layer.

In one embodiment, the side portion comprises a first side portion and a second side portion, and the light-obstructing layer is disposed on the first side portion or the second side portion.

In one embodiment, the side portion comprises a first side portion and a second side portion, and the light-obstructing layer is disposed on each of the first side portion and the second side portion. The light-obstructing layer is disposed on both the left and right sides, to better obstruct the leakage current generated by the backlight.

In one embodiment, the light-obstructing layer is made of a non-metallic material, and the light-obstructing layer is in contact and connected to the gate layer.

In one embodiment, the light-obstructing layer comprises a first light-obstructing layer disposed on the first side portion and a second light-obstructing layer disposed on the second side portion. A length of the first light-obstructing layer on the first side portion is less than a length of the second light-obstructing layer on the second side portion. A height of the first light-obstructing layer is less than the first side portion, and a height of the second light-obstructing layer is less than the second side portion. Herein, the specific length comparison of the first light-obstructing layer and the second light-obstructing layer and their height forms are provided to better obstruct the leakage current generated by the backlight, and enhance the availability.

In one embodiment, an amorphous silicon layer corresponding to the insulation medium layer is disposed on the insulation medium layer. An Ohmic contact layer corresponding to the amorphous silicon layer is disposed on the amorphous silicon layer. Separated source layer and drain layer of the active switch are disposed on two ends of the Ohmic contact layer. A trench is disposed between the source layer and the drain layer, and the trench passes through the Ohmic contact layer. A bottom portion of the trench is the amorphous silicon layer. This is the configuration of the gate layer, the source layer and the drain layer in practice.

In one embodiment, the side portion comprises a first side portion and a second side portion. The light-obstructing layer comprises a first light-obstructing layer disposed on the first side portion and a second light-obstructing layer disposed on the second side portion. Boundaries of the insulation medium layer, the amorphous silicon layer, the Ohmic contact layer and the source layer on one side of the gate layer are flush with one another to form a first boundary, and a length of the first light-obstructing layer is equal to or exceeds the first boundary. Boundaries of the insulation medium layer, the amorphous silicon layer, the Ohmic contact layer and the drain layer on the other side of the gate layer are flush with one another to form a second boundary, and a length of the second light-obstructing layer is equal to or exceeds the second boundary. This is to define the lengths of the first light-obstructing layer and the second light-obstructing layer with reference to other layers.

In one embodiment, the substrate comprises a first substrate and a second substrate, and the active switch and a color filter layer are disposed on the first substrate. This is the configuration of the display panel of the COA technology.

According to another aspect of this disclosure, this disclosure also discloses a manufacturing method of a display panel comprising a substrate and an active switch. The method comprises steps of: disposing the active switch on the substrate; and disposing a light-obstructing layer on an insulation medium layer on two sides of a gate layer of the active switch.

According to another aspect of this disclosure, this disclosure further discloses a display device including a backlight module and the above-mentioned display panel.

In this disclosure, the light-obstructing layer is disposed on the insulation medium layer on the lateral side of the gate layer. The light-obstructing layer obstructs the leakage current generated by the backlight to enhance the quality of the active switch (thin film transistor, TFT) device and lengthen the effective normal lifetime of the display panel.

BRIEF DESCRIPTION OF THE DRAWINGS

The embodiments will become more fully understood from the detailed description and accompanying drawings, which are given for illustration only, and thus are not limitative of the present invention, and wherein.

Figure 1:
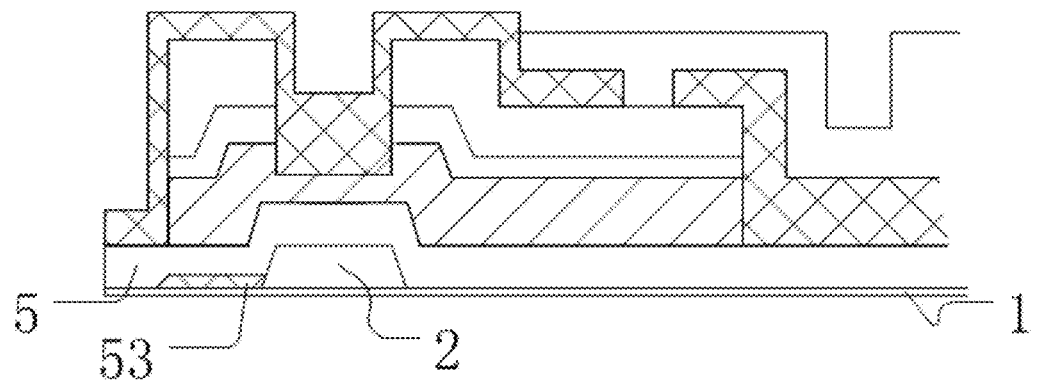
FIG. 1 is a schematic structure view showing a display panel according to an embodiment of this disclosure.

Wherein, 1: substrate; 11: first substrate; 12: second substrate; 13: color filter layer; 2: gate layer; 3: source layer; 4: drain layer; 5: insulation medium layer; 51: first light-obstructing layer; 52: second light-obstructing layer; 53: light-obstructing layer; 6: amorphous silicon layer; 7: Ohmic contact layer; 8: protection layer; 9: transparent electroconductive layer.

DETAILED DESCRIPTION OF THE INVENTION

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up," "down," "left," "right," "vertical", "horizontal", "top," "bottom," "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first," and "second" are used for the illustrative purpose only and cannot be understood as indicating or implying the relative importance or implicitly specifying the number of indicated technical features. Therefore, the features restricted by "first" and "second" may expressly or implicitly comprise one or multiple ones of the features. In the description of this disclosure, unless otherwise described, the meaning of "multiple" comprises two or more than two. In addition, the terms "comprises" and any modification thereof intend to cover the non-exclusive inclusions.

In the description of this disclosure, it needs to be described that, unless otherwise expressly stated and limited, the terms "mount," "link" and "connect" should be broadly understood. For example, they may be the fixed connection, may be the detachable connection or may be the integral connection; may be the mechanical connection or may also be the electrical connection; or may be the direct connection, may be the indirect connection through a middle medium or may be the inner communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one," "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

This disclosure is further described below with reference to the accompanying drawings and examples.

Referring to FIGS. 1-4, a display panel according to an embodiment of the disclosure comprises a substrate and a plurality of active switches disposed on the substrate. The active switch comprises a gate layer disposed on a bottom portion, the gate layer is wound with an insulation medium layer, and the insulation medium layer comprises a light-obstructing layer disposed on a side portion of the gate layer. The light-obstructing layer is disposed on the insulation medium layer on the lateral side of the gate layer. The light-obstructing layer obstructs the leakage current generated by the backlight to enhance the quality of the active switch (thin film transistor, TFT) device and lengthen the effective normal lifetime of the display panel.

In different embodiments, the active switch may be, for example, a thin film transistor (TFT).

Figure 2:
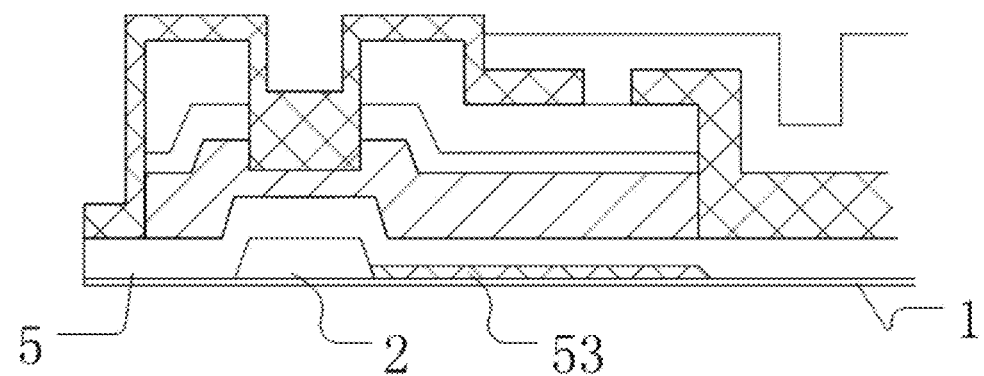
FIG. 2 is a schematic structure view showing a display panel according to an embodiment of this disclosure.

Referring to FIGS. 1-2, a display panel according to an embodiment of the disclosure comprises a substrate and a plurality of active switches disposed on the substrate. The active switch comprises a gate layer disposed on a bottom portion, the gate layer is wound with an insulation medium layer, and the insulation medium layer comprises a light-obstructing layer disposed on a side portion of the gate layer. The side portion comprises a first side portion and a second side portion; and the light-obstructing layer is disposed on the first side portion or the second side portion. The light-obstructing layer is disposed on the insulation medium layer on the lateral side of the gate layer. The light-obstructing layer obstructs the leakage current generated by the backlight to enhance the quality of the active switch (thin film transistor, TFT) device and lengthen the effective normal lifetime of the display panel.

Specifically, the light-obstructing layer is made of a non-metallic material, and the light-obstructing layer is in contact with and connected to the gate layer. The light-obstructing layer may be made of a resin material. The resin (resin craft) typically means a raw material, such as polyethelyne resin, polypropylene resin, polyester resin or the like. The light-obstructing layer may be made of a non-metallic black matrix (BM) to avoid the backlight leakage, increase the display contrast ratio, avoid the mixed color and increase the purity of the color.

Specifically, the side portion comprises a first side portion and a second side portion, and the light-obstructing layer comprises a first light-obstructing layer disposed on the first side portion and a second light-obstructing layer disposed on the second side portion. A length of the first light-obstructing layer on the first side portion is less than a length of the second light-obstructing layer on the second side portion, a height of the first light-obstructing layer is less than the first side portion, and a height of the second light-obstructing layer is less than the second side portion. Herein, the specific length comparison of the first light-obstructing layer and the second light-obstructing layer and their height forms are provided to better obstruct the leakage current generated by the backlight, and enhance the availability.

Specifically, an amorphous silicon layer corresponding to the insulation medium layer is disposed on the insulation medium layer, an Ohmic contact layer corresponding to the amorphous silicon layer is disposed on the amorphous silicon layer, separated source layer and drain layer of the active switch are disposed on two ends of the Ohmic contact layer, a trench is disposed between the source layer and the drain layer, the trench passes through the Ohmic contact layer, and a bottom portion of the trench is the amorphous silicon layer. Here shows the specific configurations between the gate layer, the source layer and the drain layer.

Specifically, the side portion comprises a first side portion and a second side portion, and the light-obstructing layer comprises a first light-obstructing layer disposed on the first side portion and a second light-obstructing layer disposed on the second side portion. Boundaries of the insulation medium layer, the amorphous silicon layer, the Ohmic contact layer and the source layer on one side of the gate layer are flush with one another to form a first boundary, and a length of the first light-obstructing layer is equal to or exceeds the first boundary. Boundaries of the insulation medium layer, the amorphous silicon layer, the Ohmic contact layer and the drain layer on the other side of the gate layer are flush with one another to form a second boundary, and a length of the second light-obstructing layer is equal to or exceeds the second boundary. A length of the first light-obstructing layer on the first side portion is less than a length of the second light-obstructing layer on the second side portion, a height of the first light-obstructing layer is less than the first side portion, and a height of the second light-obstructing layer is less than the second side portion. With other layers as a reference, specific length values of the first light-obstructing layer and the second light-obstructing layer are specified.

Specifically, a protection layer is disposed on the source layer and the drain layer, a transparent electroconductive layer is disposed on the protection layer, the protection layer is formed with a through hole corresponding to the drain layer, and the transparent electroconductive layer is connected to the drain layer through the through hole.

The gate layer is in the form of plated aluminum (Al) or molybdenum (Mo). The amorphous silicon layer serves as a channel layer using the non-crystalline silicon. Of course, another semiconductor layer material may also be used. The Ohmic contact layer adopts the silicon with the high concentration of phosphorus to reduce the interface potential difference. The source layer and the drain layer are made of molybdenum (Mo) or aluminum (Al). Aluminum has the light weight, can withstand the erosion, has the very rich resources, and is widely used according to its light weight, good electroconductivity and thermal conductivity, high reflectivity and oxidation-resistivity. The molybdenum or molybdenum alloy can achieve the better adhesion, wherein one side thereof can be better adhered to the metal of the middle electroconductive layer, such as copper, aluminum, silver, gold, chromium, molybdenum or the like, and the other side thereof may be better adhered to the other layer of the display panel, such as the substrate, resist layer, insulating layer or the like. The materials can be easily selected, and the production technology is well developed. The insulation medium layer is made of a silicon nitride compound (SiNx).

Figure 3:
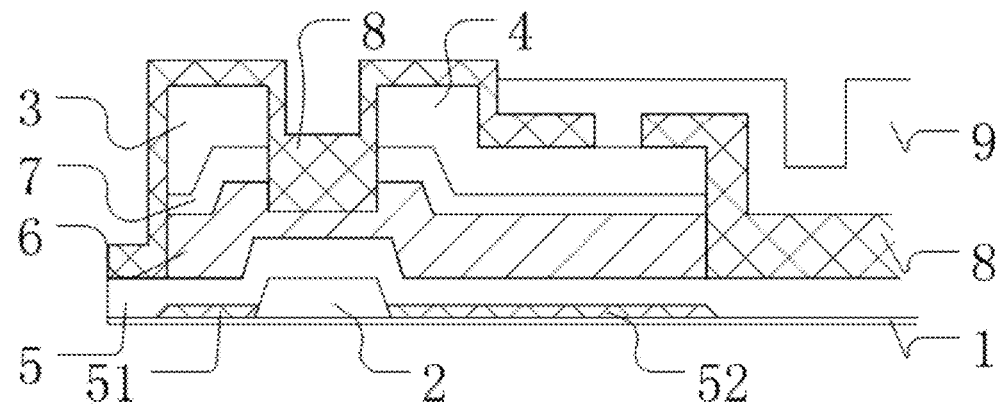
FIG. 3 is a schematic structure view showing a display panel according to an embodiment of this disclosure.
Figure 4:
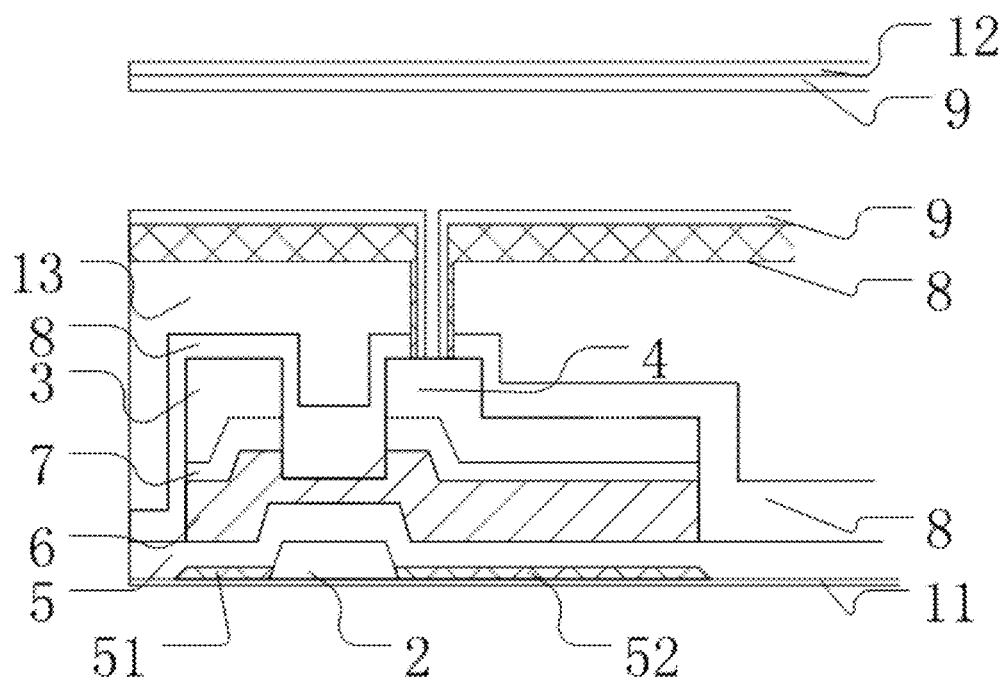
FIG. 4 is a schematic structure view showing a display panel according to an embodiment of this disclosure.

As an embodiment of the present disclosure, as shown in FIG. 3, the display panel includes a substrate; and a plurality of active switches disposed on the substrate. The active switch includes a gate layer disposed on a bottom portion. The gate layer is wound with an insulation medium layer. The insulation medium layer includes a light-obstructing layer disposed on a side portion of the gate layer. The side portion includes a first side portion and a second side portion. The light-obstructing layer is disposed on the first side portion and the second side portion. The light-obstructing layer is disposed on both the left and right sides to better obstruct the leakage current generated by the backlight. The light-obstructing layer is disposed on the insulation medium layer on the lateral side of the gate layer. The light-obstructing layer obstructs the leakage current generated by the backlight to enhance the quality of the active switch (thin film transistor, TFT) device and lengthen the effective normal lifetime of the display panel.

Specifically, the light-obstructing layer is made of a non-metallic material, and the light-obstructing layer is in contact with and connected to the gate layer. The light-obstructing layer may be made of a resin material. The resin (resin craft) typically means a raw material, such as polyethelyne resin, polypropylene resin, polyester resin or the like. The light-obstructing layer may be made of a non-metallic black matrix (BM) to avoid the backlight leakage, increase the display contrast ratio, avoid the mixed color and increase the purity of the color.

Specifically, the side portion comprises a first side portion and a second side portion, and the light-obstructing layer comprises a first light-obstructing layer disposed on the first side portion and a second light-obstructing layer disposed on the second side portion. A length of the first light-obstructing layer on the first side portion is less than a length of the second light-obstructing layer on the second side portion, a height of the first light-obstructing layer is less than the first side portion, and a height of the second light-obstructing layer is less than the second side portion. Herein, the specific length comparison of the first light-obstructing layer and the second light-obstructing layer and their height forms are provided to better obstruct the leakage current generated by the backlight, and enhance the availability.

Specifically, an amorphous silicon layer corresponding to the insulation medium layer is disposed on the insulation medium layer, an Ohmic contact layer corresponding to the amorphous silicon layer is disposed on the amorphous silicon layer, separated source layer and drain layer of the active switch are disposed on two ends of the Ohmic contact layer, a trench is disposed between the source layer and the drain layer, the trench passes through the Ohmic contact layer, and a bottom portion of the trench is the amorphous silicon layer. Here shows the specific configurations between the gate layer, the source layer and the drain layer.

Specifically, the side portion comprises a first side portion and a second side portion, and the light-obstructing layer comprises a first light-obstructing layer disposed on the first side portion and a second light-obstructing layer disposed on the second side portion. Boundaries of the insulation medium layer, the amorphous silicon layer, the Ohmic contact layer and the source layer on one side of the gate layer are flush with one another to form a first boundary, and a length of the first light-obstructing layer is equal to or exceeds the first boundary. Boundaries of the insulation medium layer, the amorphous silicon layer, the Ohmic contact layer and the drain layer on the other side of the gate layer are flush with one another to form a second boundary, and a length of the second light-obstructing layer is equal to or exceeds the second boundary. A length of the first light-obstructing layer on the first side portion is less than a length of the second light-obstructing layer on the second side portion, a height of the first light-obstructing layer is less than the first side portion, and a height of the second light-obstructing layer is less than the second side portion. With other layers as a reference, specific length values of the first light-obstructing layer and the second light-obstructing layer are specified.

Specifically, a protection layer is disposed on the source layer and the drain layer, a transparent electroconductive layer is disposed on the protection layer, the protection layer is formed with a through hole corresponding to the drain layer, and the transparent electroconductive layer is connected to the drain layer through the through hole.

The gate layer is in the form of plated aluminum (Al) or molybdenum (Mo). The amorphous silicon layer serves as a channel layer using the non-crystalline silicon. Of course, another semiconductor layer material may also be used. The Ohmic contact layer adopts the silicon with the high concentration of phosphorus to reduce the interface potential difference. The source layer and the drain layer are made of molybdenum (Mo) or aluminum (Al). Aluminum has the light weight, can withstand the erosion, has the very rich resources, and is widely used according to its light weight, good electroconductivity and thermal conductivity, high reflectivity and oxidation-resistivity. The molybdenum or molybdenum alloy can achieve the better adhesion, wherein one side thereof can be better adhered to the metal of the middle electroconductive layer, such as copper, aluminum, silver, gold, chromium, molybdenum or the like, and the other side thereof may be better adhered to the other layer of the display panel, such as the substrate, resist layer, insulating layer or the like. The materials can be easily selected, and the production technology is well developed. The insulation medium layer is made of a silicon nitride compound (SiNx).

As an embodiment of the present disclosure, as shown in FIG. 3, the display panel includes a substrate; and a plurality of active switches disposed on the substrate. The active switch includes a gate layer disposed on a bottom portion. The gate layer is wound with an insulation medium layer. The insulation medium layer includes a light-obstructing layer disposed on a side portion of the gate layer. The side portion includes a first side portion and a second side portion. The light-obstructing layer is disposed on the first side portion and the second side portion. The light-obstructing layer is disposed on both the left and right sides to better obstruct the leakage current generated by the backlight. The substrate includes the first substrate and the second substrate, wherein the active switch and the color filter layer are on the first substrate. This is the configuration of the display panel of the COA technology. The light-obstructing layer is disposed on the insulation medium layer on the lateral side of the gate layer. The light-obstructing layer obstructs the leakage current generated by the backlight to enhance the quality of the active switch (thin film transistor, TFT) device and lengthen the effective normal lifetime of the display panel.

Specifically, the light-obstructing layer is made of a non-metallic material, and the light-obstructing layer is in contact with and connected to the gate layer. The light-obstructing layer may be made of a resin material. The resin (resin craft) typically means a raw material, such as polyethelyne resin, polypropylene resin, polyester resin or the like. The light-obstructing layer may be made of a non-metallic black matrix (BM) to avoid the backlight leakage, increase the display contrast ratio, avoid the mixed color and increase the purity of the color.

Specifically, the side portion comprises a first side portion and a second side portion, and the light-obstructing layer comprises a first light-obstructing layer disposed on the first side portion and a second light-obstructing layer disposed on the second side portion. A length of the first light-obstructing layer on the first side portion is less than a length of the second light-obstructing layer on the second side portion, a height of the first light-obstructing layer is less than the first side portion, and a height of the second light-obstructing layer is less than the second side portion. Herein, the specific length comparison of the first light-obstructing layer and the second light-obstructing layer and their height forms are provided to better obstruct the leakage current generated by the backlight, and enhance the availability.

Specifically, an amorphous silicon layer corresponding to the insulation medium layer is disposed on the insulation medium layer, an Ohmic contact layer corresponding to the amorphous silicon layer is disposed on the amorphous silicon layer, separated source layer and drain layer of the active switch are disposed on two ends of the Ohmic contact layer, a trench is disposed between the source layer and the drain layer, the trench passes through the Ohmic contact layer, and a bottom portion of the trench is the amorphous silicon layer. Here shows the specific configurations between the gate layer, the source layer and the drain layer.

Specifically, the side portion comprises a first side portion and a second side portion, and the light-obstructing layer comprises a first light-obstructing layer disposed on the first side portion and a second light-obstructing layer disposed on the second side portion. Boundaries of the insulation medium layer, the amorphous silicon layer, the Ohmic contact layer and the source layer on one side of the gate layer are flush with one another to form a first boundary, and a length of the first light-obstructing layer is equal to or exceeds the first boundary. Boundaries of the insulation medium layer, the amorphous silicon layer, the Ohmic contact layer and the drain layer on the other side of the gate layer are flush with one another to form a second boundary, and a length of the second light-obstructing layer is equal to or exceeds the second boundary. A length of the first light-obstructing layer on the first side portion is less than a length of the second light-obstructing layer on the second side portion, a height of the first light-obstructing layer is less than the first side portion, and a height of the second light-obstructing layer is less than the second side portion. With other layers as a reference, specific length values of the first light-obstructing layer and the second light-obstructing layer are specified.

Specifically, a protection layer is disposed on the source layer and the drain layer, a transparent electroconductive layer is disposed on the protection layer, the protection layer is formed with a through hole corresponding to the drain layer, and the transparent electroconductive layer is connected to the drain layer through the through hole.

The gate layer is in the form of plated aluminum (Al) or molybdenum (Mo). The amorphous silicon layer serves as a channel layer using the non-crystalline silicon. Of course, another semiconductor layer material may also be used. The Ohmic contact layer adopts the silicon with the high concentration of phosphorus to reduce the interface potential difference. The source layer and the drain layer are made of molybdenum (Mo) or aluminum (Al). Aluminum has the light weight, can withstand the erosion, has the very rich resources, and is widely used according to its light weight, good electroconductivity and thermal conductivity, high reflectivity and oxidation-resistivity. The molybdenum or molybdenum alloy can achieve the better adhesion, wherein one side thereof can be better adhered to the metal of the middle electroconductive layer, such as copper, aluminum, silver, gold, chromium, molybdenum or the like, and the other side thereof may be better adhered to the other layer of the display panel, such as the substrate, resist layer, insulating layer or the like. The materials can be easily selected, and the production technology is well developed. The insulation medium layer is made of a silicon nitride compound (SiNx).

Figure 5:
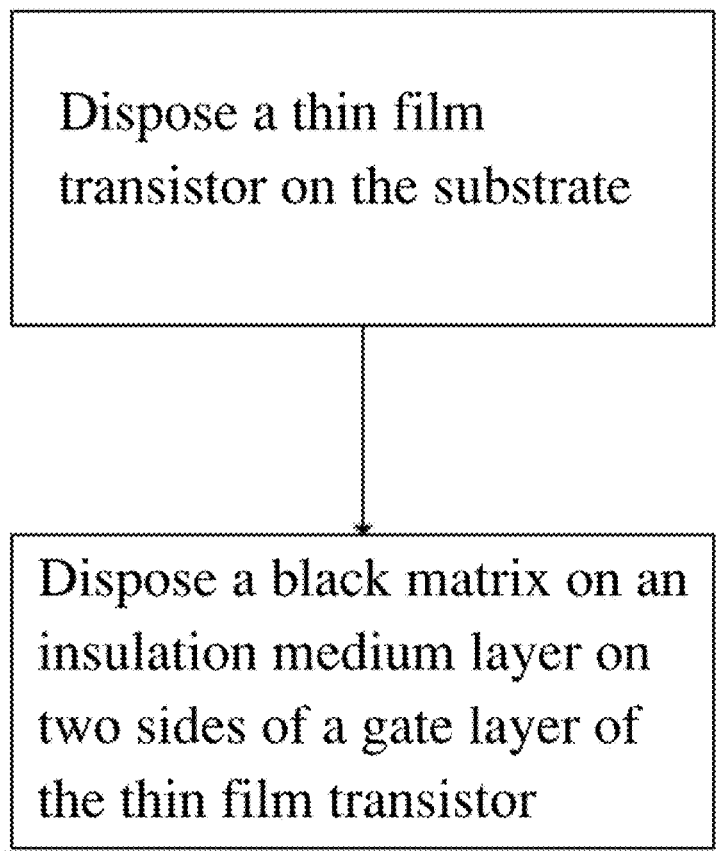
FIG. 5 is a schematic flow chart showing a manufacturing method of a display panel according to an embodiment of this disclosure.

In another embodiment of the disclosure, as shown in FIG. 5, the display panel comprises a substrate and an active switch, and the method comprises steps of: disposing the active switch on the substrate; and disposing a light-obstructing layer on an insulation medium layer on two sides of a gate layer of the active switch.

Specifically, the side portion includes a first side portion and a second side portion. The light-obstructing layer is disposed on the first side portion and/or the second side portion.

Specifically, the light-obstructing layer is made of a non-metallic material, and the light-obstructing layer is in contact with and connected to the gate layer. The light-obstructing layer may be made of a resin material. The resin (resin craft) typically means a raw material, such as polyethelyne resin, polypropylene resin, polyester resin or the like. The light-obstructing layer may be made of a non-metallic black matrix (BM) to avoid the backlight leakage, increase the display contrast ratio, avoid the mixed color and increase the purity of the color.

Specifically, the side portion comprises a first side portion and a second side portion, and the light-obstructing layer comprises a first light-obstructing layer disposed on the first side portion and a second light-obstructing layer disposed on the second side portion. A length of the first light-obstructing layer on the first side portion is less than a length of the second light-obstructing layer on the second side portion, a height of the first light-obstructing layer is less than the first side portion, and a height of the second light-obstructing layer is less than the second side portion. Herein, the specific length comparison of the first light-obstructing layer and the second light-obstructing layer and their height forms are provided to better obstruct the leakage current generated by the backlight, and enhance the availability.

Specifically, an amorphous silicon layer corresponding to the insulation medium layer is disposed on the insulation medium layer, an Ohmic contact layer corresponding to the amorphous silicon layer is disposed on the amorphous silicon layer, separated source layer and drain layer of the active switch are disposed on two ends of the Ohmic contact layer, a trench is disposed between the source layer and the drain layer, the trench passes through the Ohmic contact layer, and a bottom portion of the trench is the amorphous silicon layer. Here shows the specific configurations between the gate layer, the source layer and the drain layer.

Specifically, the side portion comprises a first side portion and a second side portion, and the light-obstructing layer comprises a first light-obstructing layer disposed on the first side portion and a second light-obstructing layer disposed on the second side portion. Boundaries of the insulation medium layer, the amorphous silicon layer, the Ohmic contact layer and the source layer on one side of the gate layer are flush with one another to form a first boundary, and a length of the first light-obstructing layer is equal to or exceeds the first boundary. Boundaries of the insulation medium layer, the amorphous silicon layer, the Ohmic contact layer and the drain layer on the other side of the gate layer are flush with one another to form a second boundary, and a length of the second light-obstructing layer is equal to or exceeds the second boundary. A length of the first light-obstructing layer on the first side portion is less than a length of the second light-obstructing layer on the second side portion, a height of the first light-obstructing layer is less than the first side portion, and a height of the second light-obstructing layer is less than the second side portion. With other layers as a reference, specific length values of the first light-obstructing layer and the second light-obstructing layer are specified.

Specifically, a protection layer is disposed on the source layer and the drain layer, a transparent electroconductive layer is disposed on the protection layer, the protection layer is formed with a through hole corresponding to the drain layer, and the transparent electroconductive layer is connected to the drain layer through the through hole.

Specifically, the substrate includes the first substrate and the second substrate, wherein the active switch and the color filter layer are on the first substrate. This is the configuration of the display panel of the COA technology.

In another embodiment of the disclosure, the display device comprises a backlight module and the above-mentioned display panel.

To be noted, in the above embodiment, the material of the substrate can be optionally glass or plastics.

In the above embodiment, the display panel comprises liquid crystal panel, OLED panel, curved panel, plasma panel, and the likes. Taking a liquid crystal panel as an example, the liquid crystal panel comprises a TFT substrate and a CF substrate, which are disposed opposite to each other. The liquid crystal molecules and photo spacers are disposed between the TFT substrate and the CF substrate. The TFT substrate is configured with an active switch, which can be a thin-film transistor, and the CF substrate is configured with a color filter layer.

In the above embodiment, the CF substrate can also be configured with the TFT array, and the color filter layer and the TFT array are disposed on the same substrate. Alternatively, the TFT may also comprise the color filter layer.

In the above embodiment, the display panel of the disclosure can be a curved panel.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel, comprising:
 a substrate; and
 a plurality of active switches disposed on the substrate, wherein each active switch of the plurality of active switches comprises a gate layer disposed at a bottom portion of the active switch, the gate layer is wound with an insulation medium layer, and the insulation medium layer comprises a first light-obstructing layer merely disposed on a first side portion of the gate layer and a second light-obstructing layer merely disposed on a second side portion of the gate layer; the first light-obstructing layer and the second light-obstructing layer are made of a non-metallic material, the first light-obstructing layer and the second light-obstructing layer are in contact and connected to the gate layer; a length of the first light-obstructing layer on the first side portion is less than a length of the second light-obstructing layer on the second side portion, a height of the first light-obstructing layer is less than the first side portion, and a height of the second light-obstructing layer is less than the second side portion; and the substrate is a first substrate, and the plurality of active switches and a color filter layer are disposed on the first substrate.

2. The display panel according to claim 1, wherein an amorphous silicon layer is disposed on the insulation medium layer, an Ohmic contact layer is disposed on the amorphous silicon layer, a source layer and a drain layer of the plurality of active switches are separately disposed on two ends of the Ohmic contact layer, a trench is disposed between the source layer and the drain layer, the trench passes through the Ohmic contact layer, and a bottom portion of the trench is the amorphous silicon layer.

3. The display panel according to claim 2, wherein boundaries of the insulation medium layer, the amorphous silicon layer, the Ohmic contact layer and the source layer on one side of the gate layer are flush with one another to form a first boundary, and the length of the first light-obstructing layer is equal to or exceeds a distance between the first boundary and the first side portion; and boundaries of the insulation medium layer, the amorphous silicon layer, the Ohmic contact layer and the drain layer on the other side of the gate layer are flush with one another to form a second boundary, and the of the second light-obstructing layer is equal to or exceeds a distance between the second boundary and the second side portion.

* * * * *